United States Patent
Huang et al.

(10) Patent No.: US 6,651,194 B1
(45) Date of Patent: Nov. 18, 2003

(54) METHOD AND APPARATUS FOR INTERLEAVING AN INCOMING STREAM OF DATA BLOCKS

(75) Inventors: Hsien-Chun Huang, Changhua Hsien (TW); Ching-Kae Tzou, Hsinchu Hsien (TW); Wei-Gian Chen, Taipei (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 546 days.

(21) Appl. No.: 09/638,114

(22) Filed: Aug. 14, 2000

(51) Int. Cl.[7] .......................... G06F 11/00; H03M 13/00
(52) U.S. Cl. ........................................ 714/701; 714/762
(58) Field of Search ................................. 714/701, 702, 714/761, 762

(56) References Cited

U.S. PATENT DOCUMENTS

| | | | | |
|---|---|---|---|---|
| 5,636,224 A | * | 6/1997 | Voith et al. ................. | 714/701 |
| 5,691,993 A | * | 11/1997 | Fredrickson ................ | 714/761 |
| 5,764,649 A | * | 6/1998 | Tong .......................... | 714/701 |
| 6,035,427 A | * | 3/2000 | Kweon ....................... | 714/702 |
| 6,105,159 A | * | 8/2000 | Frederickson ............... | 714/762 |

* cited by examiner

Primary Examiner—Phung M. Chung
Assistant Examiner—Cynthia Britt
(74) Attorney, Agent, or Firm—Ladas & Parry

(57) ABSTRACT

An apparatus is adapted for interleaving an incoming stream of data blocks, each of which has a predetermined number (N) of block units indexed consecutively from 0 to (N−1), The interleaving is accomplished at a predetermined interleaving depth (D). A first one of the block units has no delay associated therewith, and subsequent ones of the block units in a designated one of the data blocks have a delay equal to (D−1) more than an immediately preceding one of the block units in the designated one of the data blocks. The apparatus includes a data buffer configured to have a number of lines equal to (N−1), an output unit, and a control unit. Each of the lines has a size sufficient to accommodate a predetermined number of the block units. The output unit outputs one of the block units of the incoming stream directly when the delay associated therewith is equal to zero. When the delay associated with one of the block units of the incoming stream is not equal to zero, the control unit generates a reading index for reading one of the block units stored in the data buffer, controls the output unit to output the block unit read from the data buffer, generates a writing index, and stores the block unit of the incoming stream in the respective one of the lines of the data buffer in accordance with the writing index. A method for interleaving the same is also disclosed.

24 Claims, 3 Drawing Sheets

| ORIGINAL DATA | $B^j_0$ | $B^j_1$ | $B^j_2$ | $B^j_3$ | $B^j_4$ | $B^{j+1}_0$ | $B^{j+1}_1$ | $B^{j+1}_2$ | $B^{j+1}_3$ | $B^{j+1}_4$ |
|---|---|---|---|---|---|---|---|---|---|---|
| INTERLEAVED DATA | $B^j_0$ | $B^{j-1}_3$ | $B^j_1$ | $B^{j-1}_4$ | $B^j_2$ | $B^{j+1}_0$ | $B^j_3$ | $B^{j+1}_1$ | $B^j_4$ | $B^{j+1}_2$ |
| DE-INTERLEAVED DATA | $B^{j-1}_1$ | $B^{j-1}_2$ | $B^{j-1}_3$ | $B^{j-1}_4$ | $B^j_0$ | $B^j_1$ | $B^j_2$ | $B^j_3$ | $B^j_4$ | $B^{j+1}_0$ |

| (N=9; D=4) | | | | |
|---|---|---|---|---|
| | DATA BLOCK 110 | DATA BLOCK 111 | DATA BLOCK 112 | DATA BLOCK 113 |
| ORIGINAL DATA | $A_0 A_1 A_2 A_3 A_4 A_5 A_6 A_7 A_8$ | $B_0 B_1 B_2 B_3 B_4 B_5 B_6 B_7 B_8$ | $C_0 C_1 C_2 C_3 C_4 C_5 C_6 C_7 C_8$ | $D_0 D_1 D_2 D_3 D_4 D_5 D_6 D_7 D_8$ |
| INTERLEAVED DATA | $A_0 X_7 Y_5 Z_3 A_1 X_8 Y_6 Z_4 A_2$ | $B_0 Y_7 Z_5 A_3 B_1 Y_8 Z_6 A_4 B_2$ | $C_0 Z_7 A_5 B_3 C_1 Z_8 A_6 B_4 C_2$ | $D_0 A_7 B_5 C_3 D_1 A_8 B_6 C_4 D_2$ |
| DE-INTERLEAVED DATA | $Y_2 Y_3 Y_4 Y_5 Y_6 Y_7 Y_8 Z_0 Z_1$ | $Z_2 Z_3 Z_4 Z_5 Z_6 Z_7 Z_8 A_0 A_1$ | $A_2 A_3 A_4 A_5 A_6 A_7 A_8 B_0 B_1$ | $B_2 B_3 B_4 B_5 B_6 B_7 B_8 C_0 C_1$ |

METHOD AND APPARATUS FOR INTERLEAVING AN INCOMING STREAM OF DATA BLOCKS

BACKGROUND OF THE INVENTION

1. Field of the Invention

The invention relates to a method and apparatus for interleaving an incoming stream of data blocks, more particularly a method and apparatus for interleaving an incoming stream of data blocks that are used for asymmetric digital subscriber line (ADSL) digital communication systems.

2. Description of the Related Art

In data communications systems, such as Asymmetric Digital Subscriber Lines (ADSL), noise transmission lines can cause data to be corrupted or lost. In order to correct errors and recover lost data, additional error-checking data is often transmitted along with the transmitted data (payload data). The combination of a group of payload data bytes and the error-checking data for the group payload data bytes is referred to as a codeword. The receiving end of the data transmission can determine if errors have occurred in a particular codeword based on the payload data and error-checking data received. If the amount of error or loss in a codeword is relatively small, the error-checking data can be used to recover the correct payload data. Bursts of noise on the transmission media may cause the severity of data corruption in a codeword to be such that recovery is not possible. In order to reduce the impact of these bursts of noise, data interleaving techniques can be employed. By interleaving data from different codewords before transmission and de-interleaving the received data at the receiver, the impact of a burst of noise is spread over a number of different codewords, thus reducing the loss in each codeword to a level where recovery of the payload data in each codeword is possible.

Generally, there are two types of interleaving techniques, namely block interleaving and convolutional interleaving, used in a data communication system. In ADSL G.992.1, the convolutional technique is used because of its lower memory requirement and end-to-end delay than those of block interleaving. In ADSL G.992.1, the pattern of interleaving is controlled by two parameters. The first is the number of bytes of data in each codeword, which is represented by the number (N). The second is the interleaving depth, which is represented by the number (D). Convolutional interleaving in ADSL requires that each of the N bytes $B_0, B_1, \ldots, B_{N-1}$ in a codeword be delayed by an amount the varies linearly with the byte index. Byte $B_i$ (the byte of the codeword with index i) is delayed by $(D-1)*i$ bytes.

Referring to FIG. 1, a table of an illustrative example (N=5, D=2) is shown, where $B^j_i$ denotes the i-th byte of the j-th codeword. The codeword $B^j$ at the first row of the table represents the original codeword before interleaving, and it is spread into an interval of two codewords after the interleaving operation. If a string of three errors, such as $B^{j-1}_4$, $B^j_2$, $B^{j+1}_0$, occurs during data transmission, as shown at the second row of the table, the errors are spread out after de-interleaving, as shown at third row of the table.

According to the above delay rule, an amount of memory is necessary to store an incoming stream for interleaving. A codeword is stored in the memory in a specific order, and is transmitted in another order. The amount of memory required to perform the illustrated method could be up to N*D bytes in an ordinary interleaving design. In ADSL G.992.1, the maximum codeword size (N) is equal to 255, and the interleaving depth (D) can be up to 64. Thus, the amount of memory can be as large as 16K bytes. Moreover, the memory is required in both the transmitter and receiver to perform the interleaving and de-interleaving, respectively. In hardware implementation, these large memory blocks occupy relatively large die areas.

In U.S. Pat. No. 5,636,224, an amount of memory equal to about (N*D)/2 is required. In U.S. Pat. No. 5,764,649, an amount of memory equal to (N−1)*(D−1)/2 is required. However, complex operations are involved.

SUMMARY OF THE INVENTION

Therefore, the object of the present invention is to provide a method and apparatus for interleaving an incoming stream of data blocks that can reduce the amount of memory required to perform the interleaving of the incoming stream with minimum complexity.

According to one aspect of the present invention, a method is provided for interleaving an incoming stream of data blocks. The interleaving is accomplished at a predetermined interleaving depth (D) Each of the data blocks has a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the block units in the designated one of the data blocks. The method includes the steps of:

(a) configuring a data buffer to have a number of lines equal to (N−1), each of which is used to store a respective one of the $1^{st}$ to (N−1)th block units, each of the lines having a size sufficient to accommodate a predetermined number of the block units, the predetermined number being a smallest integer equal to or larger than a quotient of the delay associated with the respective one of the $1^{st}$ to (N−1)th block units divided by the number (N);

(b) outputting one of the block units of the incoming stream directly when the delay associated therewith is equal to zero;

(c) when the delay associated with said one of the block units of the incoming stream is not equal to zero, generating a reading index for reading one of the block units stored in the data buffer, outputting said one of the block units read from the data buffer, generating a writing index, and storing said one of the block units of the incoming stream in the respective one of the lines of the data buffer in accordance with the writing index; and (d) repeating steps (b) and (c) for succeeding ones of the block units of the incoming stream.

According to another aspect of the present invention, a method is provided for interleaving an incoming stream of data blocks. The interleaving is accomplished at a predetermined interleaving depth (D) Each of the data blocks has a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the block units in the designated one of the data blocks. The method includes the steps of:

(a) providing a multiplexer that is connected to a data buffer and that receives the incoming stream;

(b) controlling the multiplexer to output one of the block units of the incoming stream when the delay associated therewith is equal to zero;

(c) when the delay associated with said one of the block units of the incoming stream is not equal to zero, generating a reading index for reading one of the data units stored in the data buffer, controlling the multiplexer to output said one of the block units read from the data buffer, generating a writing index, and storing said one of the block units of the incoming stream in the data buffer in accordance with the writing index; and (d) repeating steps (b) and (c) for succeeding ones of the block units of the incoming stream.

According to still another aspect of the present invention, an apparatus is adapted for interleaving an incoming stream of data blocks. The interleaving is accomplished at a predetermined interleaving depth (d). Each of the data blocks has a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the block units in the designated one of the data blocks. The apparatus includes a data buffer, output means, and control means.

The data buffer is configured to have a number of lines equal to (N−1), each of which is used to store a respective one of the $1^{st}$ to (N−1)th block units. Each of the lines has a size sufficient to accommodate a predetermined number of the block units. The predetermined number is a smallest integer equal to or larger than a quotient of the delay associated with the respective one of the $1^{st}$ to (N−1)th block units divided by the number (N).

The output means outputs one of the block units of the incoming stream directly when the delay associated therewith is equal to zero.

The control means, when the delay associated with said one of the block units of the incoming stream is not equal to zero, generates a reading index for reading one of the block units stored in the data buffer, controls the output means to output said one of the block units read from the data buffer, generates a writing index, and stores said one of the block units of the incoming stream in the respective one of the lines of the data buffer in accordance with the writing index.

According to yet another aspect of the present invention, an apparatus is adapted for interleaving an incoming stream of data blocks. The interleaving is accomplished at a predetermined interleaving depth (D) Each of the data blocks has a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the block units in the designated one of the data blocks. The apparatus includes a data buffer, a multiplexer, and control means.

The multiplexer is connected to the data buffer, and is adapted to receive the incoming stream.

The control means, which is connected to the data buffer and the multiplexer, controls the multiplexer to output one of the block units of the incoming stream when the delay associated therewith is equal to zero. When the delay associated with said one of the block units of the incoming stream is not equal to zero, the control means generates a reading index for reading one of the block units stored in the data buffer, controls the multiplexer to output said one of the block units read from the data buffer, generates a writing index, and stores said one of the block units of the incoming stream in the data buffer in accordance with the writing index.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENT

Figures 1, 2:
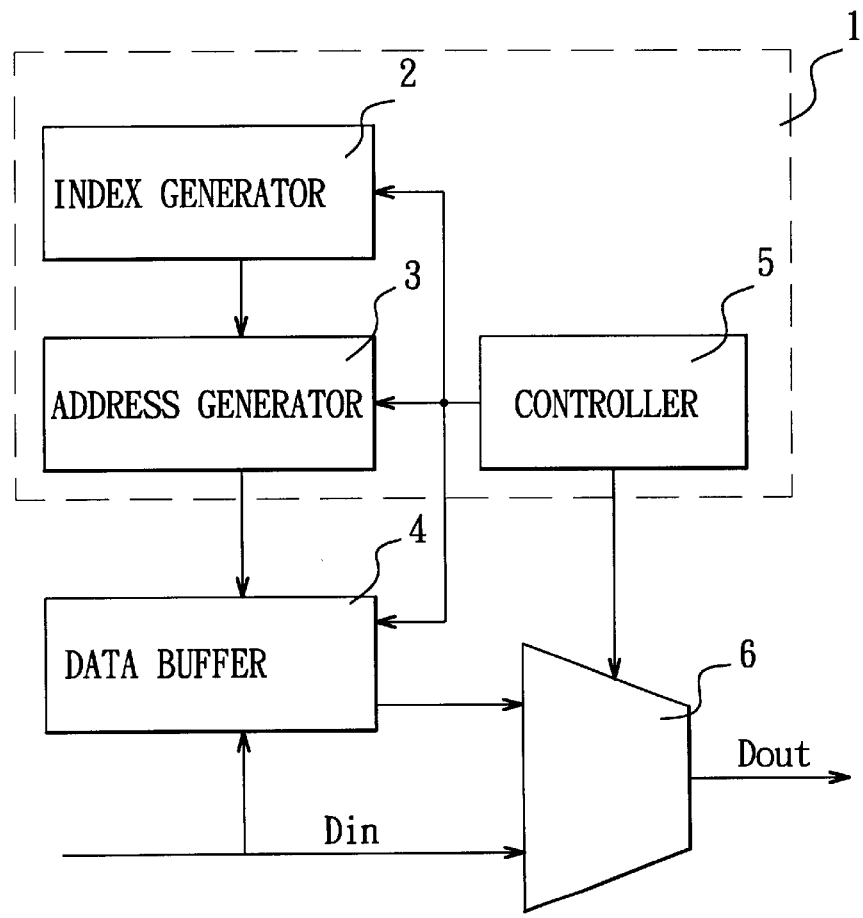
FIG. 1 is a table of a convolutional interleaving/de-interleaving example when the interleaving depth is equal to 2 and there are five block units in a data block.
FIG. 2 is a block schematic electrical circuit diagram illustrating the preferred embodiment of an apparatus for interleaving an incoming stream of data blocks according to this invention.

Referring to FIG. 2, according to the preferred embodiment of this invention, an apparatus for interleaving an incoming stream (Din) of data blocks, such as codewords, is shown. The interleaving is accomplished at a predetermined interleaving depth (D). Each of the data blocks has a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the blocks units in the designated one of the data blocks. The apparatus includes a data buffer 4, a multiplexer 6, and control means 1.

The data buffer 4 is configured to have a number of lines equal to (N−1), each of which is used to store a respective one of the $1^{st}$ to (N−1)th block units. Each of the lines has a size sufficient to accommodate a predetermined number of block units. The predetermined number is a smallest integer equal to or larger than a quotient of the delay associated with the respective one of the $1^{st}$ to (N−1)th block units divided by the number (N).

The multiplexer 6 is connected to the data buffer 4, and is adapted to receive the incoming stream (Din). The multiplexer 6 outputs one of the block units of the incoming stream (Din) directly when the delay associated therewith is equal to zero.

The control means 1, which is connected to the data buffer 4 and the multiplexer 6, includes a controller 5, an index generator 2 and an address generator 3. The controller 5 is connected to the data buffer 4 and the multiplexer 6. The index generator 2 is connected to the data buffer 4 and the controller 5. The address generator 3 is connected to the data buffer 4, the multiplexer 5 and the index generator 2. The controller 5 controls the multiplexer 6 to output one of the block units of the incoming stream (Din) when the delay associated therewith is equal to zero. When the delay associated with said one of the block units of the incoming stream (Din) is not equal to zero, the index generator 2 generates a reading index to the address generator 3 for reading one of the block units stored in the data buffer 4, the controller 5 controls the multiplexer 6 to output said one of the block units read from the data buffer 4, the index generator 2 generates a writing index, and the controller 4 stores said one of the block units of the incoming stream (Din) in the data buffer 4 in accordance with the writing index. The control means 1 reads the lines of the data buffer 4 sequentially when outputting the block units stored in the data buffer 4. The reading index is generated by incrementing a variable (i) under modulo N conditions. The writing index is equal to a remainder of the quotient of the sum of the index of the block unit in the corresponding data block of the incoming stream (Din) and the delay associated therewith, divided by the number (N). For the lines of the data buffer 4 having a size sufficient to accommodate more than one of the block units, the control means 1 stores and reads the block units therefrom in a first-in, first-out manner. After each reading or writing operation of the lines of the data buffer 4, the controller 5 checks address boundary conditions of the lines, and resets a subsequent memory access address for the lines to a predetermined starting address when the subsequent memory access address does not fall within the address boundary conditions.

Figures 4, 5:
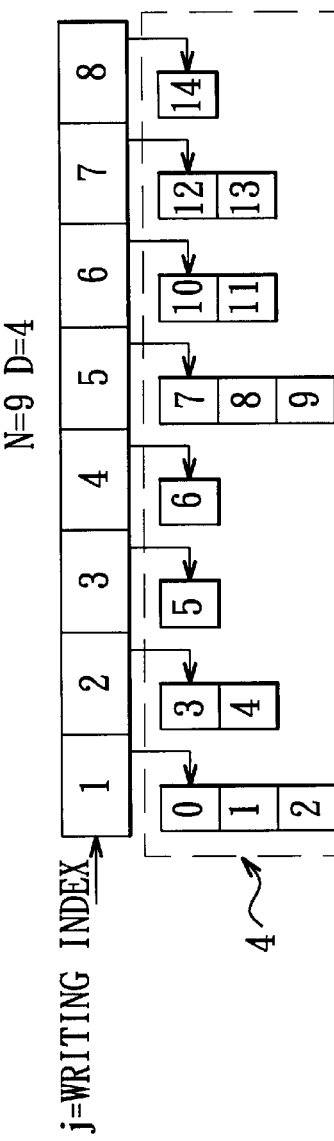
FIG. 4 illustrates an example data stream, interleaved data stream, and de-interleaved data stream.
FIG. 5 is a schematic view showing a construction of a data buffer of the preferred embodiment when the interleaving depth is equal to 4 and there are nine block units in a data block.

For example, referring to FIG. 4, the incoming stream (Din) has data blocks 110, 111, 112, 113, and the interleaving depth (D) is equal to 4. Each of the data blocks 110, 111, 112, 113 has the number (N), which is equal to 9, of block units ($A_0, A_1, \ldots, A_8; B_0, B_1, \ldots, B_8; C_0, C_1, \ldots, C_8; D_0, D_1, \ldots, D_8$) indexed consecutively from 0 to 8. The reading index of one of the block units ($A_0, A_1, \ldots, A_8; B_0, B_1, \ldots, B_8; C_0, C_1, \ldots, C_8; D_0, D_1, \ldots, D_8$) of the incoming stream (Din) is equal to an index (i) of one of the block units ($A_0, A_1, \ldots, A_8; B_0, B_1, \ldots, B_8; C_0, C_1, \ldots, C_8; D_0, D_1, \ldots, D_8$) of the incoming stream (Din). "delay [i]", which is the delay associated with the block units ($A_0, A_1, \ldots, A_8; B_0, B_1, \ldots, B_8; C_0, C_1, \ldots, C_8; D_0, D_1, \ldots, D_8$) of the incoming stream (Din), "index [i]", which is the writing index of the block units ($A_0, A_1, \ldots, A_8; B_0, B_i, \ldots, B_8; C_0, C_1, \ldots, C_8; D_0, D_1, \ldots, D_8$) of the incoming stream (Din), and "size [j]", which is the size of one of the lines in the data buffer 4, where "j" is equal to "index [i]", in relation to the index (i), the interleaving depth (D), and the number (N) can be determined according to the following Equations 1 to 3:

$$\text{delay } [i] = (D-1)*i \quad \quad \text{(Equation 1)}$$

$$\text{index } [i] = (i + \text{delay } [i]) \text{ modulo } N, \ 0 \leq \text{index } [i] \leq N-1 \quad \text{(Equation 2)}$$

$$\text{size } [j] = \text{ceil } (\text{delay } [i]/N), \ \text{size } [j] \geq 1 \quad \quad \text{(Equation 3)},$$

where "ceil(x)" means a smallest integer equal to or larger than x.

Therefore, the delays of the block units ($A_0, A_1, \ldots, A_8; B_0, B_1, \ldots, B_8; C_0, C_1, \ldots, C_8; D_0, D_1, \ldots, D_8$) of each one of the data blocks (110, 111, 112, 113) are equal to 0, 3, 6, 9, 12, 15, 18, 21, 24, respectively. The writing indexes of the block units ($A_1, \ldots, A_8; B_1, \ldots, B_8; C_1, \ldots, C_8; D_1, \ldots, D_8$) of each one of the data blocks (110, 111, 112, 113) are equal to 4, 8, 3, 7, 2, 6, 1, 5. As such, referring to FIG. 5, the sizes of the lines, which are indexed consecutively from 1 to 8, in the data buffer 4 are equal to 1, 1, 1, 2, 2, 2, 3, 3, respectively. The address boundary conditions of the lines can be determined according to the following Equations 4 and 5:

$$upper(j) = \sum_{k=1}^{j} size[k], \ 1 \leq j \leq N-1, \ upper(0) = 0 \quad \text{(Equation 4)}$$

where "addr [j]" and "upper [j]" are respectively the starting address and the ending address of the indexed line [j] in the data buffer 4. As such, when the writing index of the block unit ($A_7$) of the data block 110 is equal to 1, the block unit ($A_7$) of the data block 110 is stored in the indexed line 1 of the data buffer 4 at a writing address equal to zero, which is the starting address thereof. Likewise, the block unit ($B_7$) of the data block 111 is stored in the indexed line 1 of the data buffer 4 at an incremented address equal to 1, and the block unit ($C_7$) of the data block 112 is stored in the indexed line 1 of the data buffer 4 at an incremented address equal to 2. Therefore, the block unit ($D_7$) of the data block 113 is stored in the indexed line 1 of the data buffer 4 at the starting address equal to zero, since the incremented address (2+1=3) for the block unit ($D_7$) does not fall within the address boundary conditions.

Figure 3:
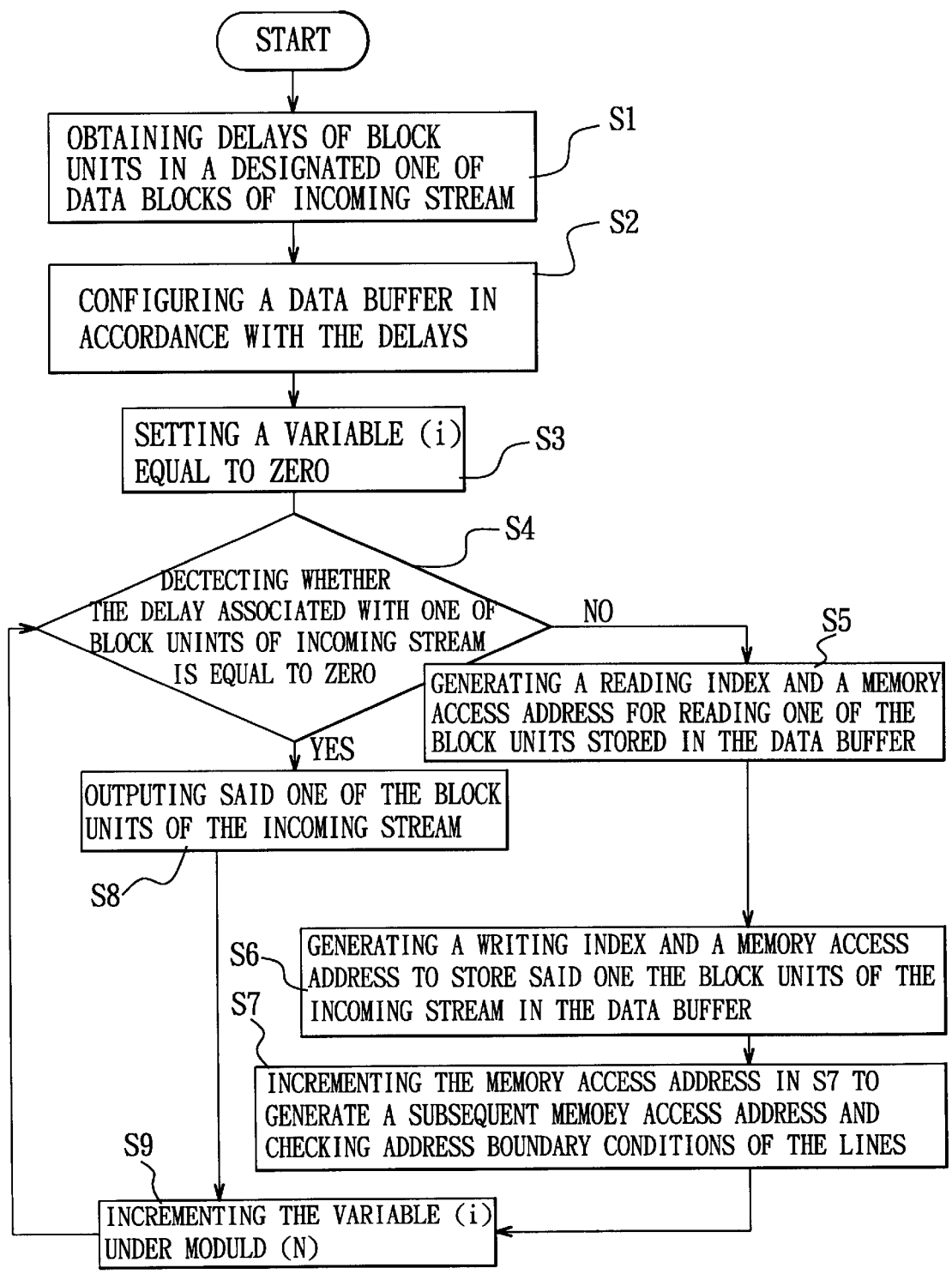
FIG. 3 is a flow chart illustrating a method of interleaving the incoming stream of the data blocks according to this invention.

Referring to FIG. 3, there is shown a flow chart to illustrate a method of interleaving an incoming stream of data blocks of the preferred embodiment according to this invention. The interleaving is accomplished at an interleaving depth (D). Each of the data blocks has a number of block units indexed consecutively from 0 to (N-1). At step S1, delays of the block units in a designated one of the data blocks of incoming stream are obtained in a known manner based At step S2, the data buffer 4 is configured in accordance with the delays based on Equation 3. The data buffer 4 has a number of lines equal to (N-1), each of which is used to store a respective one of the $1^{st}$ to (N-1)th block units. Each of the lines has a size sufficient to accommodate a predetermined number of the block units. The predetermined number is a smallest integer equal to or larger than a quotient of the delay associated with the respective one of the $1^{st}$ to (N-1)th block units divided by the number (N).

At step S3, a variable (i) is set to be equal to zero. The variable (i) is equal to an index of one of the block units in the designated one of the data blocks.

At step S4, the controller 5 detects whether the delay associated with said one of the block units of incoming stream is equal to zero.

At step S5, when the delay associated with said one of the block units of the incoming stream is not equal to zero, the controller 5 controls the index generator 2 to generate a reading index equal to the variable (i) the address generator 3 to generate a memory access address for reading one of the block units stored in the data buffer 4, and the multiplexer 6 to output said one of the block units read from the data buffer 4.

At step S6, the controller 5 controls the index generator 2 to generate a writing index, and the address generator 3 to generate a memory access address so as to store said one of the block units of the incoming stream in the respective one of the lines of the data buffer 4 in accordance with the writing index. The writing index is equal to a remainder of the quotient of the sum of the index of the block unit in the corresponding data block of the incoming stream and the delay associated therewith, divided by the number (N)

At step S7, the memory access address in step S6 is incremented to generate a subsequent memory access address, the address boundary conditions of the lines are checked, and the subsequent memory access address for the lines is reset to the predetermined starting address when the subsequent memory access address does not fall within the address boundary conditions.

At step S8, when the delay associated with said one of the block units of the incoming stream is equal to zero, the controller 5 controls the multiplexer 6 to output said one of the block units of the incoming stream directly.

At step S9, the variable (i) is incremented under modulo (N) conditions, and the flow proceeds to step S4 for processing of the subsequent block units of the incoming stream.

The following are some of the advantages of the present invention:

1. In the aforesaid example, the block units ($A_0$, $B_0$, $C_0$, $D_0$) of the data blocks 110, 111, 112, 113 are outputted directly by the multiplexer 6 at step S9 so as to omit a line indexed zero in the data buffer, thereby resulting in a smaller amount of memory as compared with that required in the apparatus of U.S. Pat. No. 5,636,224.

2. In this invention, each of the block units of the incoming stream is stored in the data buffer after reading a respective one of the block units in the data buffer, which is different from U.S. Pat. No. 5,636,224 to result in a lower memory requirement.

3. Compared with U.S. Pat. No. 5,764,649, this invention utilizes relatively simple circuits and operations to achieve the interleaving with a memory requirement near the theoretical minimal amount, which is equal to $(N-1)*(D-1)/2$, thereby resulting in lower costs.

While the present invention has been described in connection with what is considered the most practical and preferred embodiment, it is understood that this invention is not limited to the disclosed embodiment but is intended to cover various-arrangements included within the spirit and scope of the broadest interpretation so as to encompass all such modifications and equivalent arrangements.

We claim:

1. A method of interleaving an incoming stream of data blocks, the interleaving being accomplished at a predetermined interleaving depth (D), each of the data blocks having a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the block units in the designated one of the data blocks, the method comprising the steps of:

(a) configuring a data buffer to have a number of lines equal to (N−1), each of which is used to store a respective one of the $1^{st}$ to (N−1)th block units, each of the lines having a size sufficient to accommodate a predetermined number of the block units, the predetermined number being a smallest integer equal to or larger than a quotient of the delay associated with the respective one of the $1^{st}$ to (N−1)th block units divided by the number (N);

(b) outputting one of the block units of the incoming stream directly when the delay associated therewith is equal to zero;

(c) when the delay associated with said one of the block units of the incoming stream is not equal to zero, generating a reading index for reading one of the block units stored in the data buffer, outputting said one of the block units read from the data buffer, generating a writing index, and storing said one of the block units of the incoming stream in the respective one of the lines of the data buffer in accordance with the writing index; and (d) repeating steps (b) and (c) for succeeding ones of the block units of the incoming stream.

2. The method of claim 1, wherein the lines of the data buffer are read sequentially when outputting the block units stored in the data buffer.

3. The method of claim 1, wherein the reading index is generated by incrementing a variable (i) under modulo N conditions.

4. The method of claim 1, wherein the writing index is equal to a remainder of the quotient of the sum of the index of the block unit in the corresponding data block of the incoming stream and the delay associated therewith, divided by the number (N).

5. The method of claim 1, wherein, for the lines of the data buffer having a size sufficient to accommodate more than one of the block units, the block units are stored and read therefrom in a first-in, first-out manner.

6. The method of claim 1, further comprising the steps of, after each reading or writing operation of the lines of the data buffer, checking address boundary conditions of the lines, and resetting a subsequent memory access address for the lines to a predetermined starting address when the subsequent memory access address does not fall within the address boundary conditions.

7. The method of claim 1, wherein the incoming stream and the output of the data buffer are received by a multiplexer such that the block unit of the incoming stream can be outputted when the delay associated therewith is equal to zero, and such that the block unit that was read from the data buffer can be outputted when otherwise.

8. A method of interleaving an incoming stream of data blocks, the interleaving being accomplished at a predetermined interleaving depth (D), each of the data blocks having a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the block units in the designated one of the data blocks, the method comprising the steps of:

(a) providing a multiplexer that is connected to a data buffer and that receives the incoming stream;

(b) controlling the multiplexer to output one of the block units of the incoming stream when the delay associated therewith is equal to zero;

(c) when the delay associated with said one of the block units of the incoming stream is not equal to zero, generating a reading index for reading one of the block units stored in the data buffer, controlling the multiplexer to output said one of the block units read from the data buffer, generating a writing index, and storing said one of the block units of the incoming stream in the data buffer in accordance with the writing index; and (d) repeating steps (b) and (c) for succeeding ones of the block units of the incoming stream.

9. The method of claim 8, wherein the reading index is generated by incrementing a variable (i) under modulo N conditions.

10. The method of claim 8, wherein the writing index is equal to a remainder of the quotient of the sum of the index of the block unit in the corresponding data block of the incoming stream and the delay associated therewith, divided by the number (N).

11. The method of claim 8, further comprising the steps of:

configuring the data buffer to have a number of lines equal to (N−1), each of which is used to store a respective one of the $1^{st}$ to (N−1)th block units, each of the lines having a size sufficient to accommodate a predetermined number of the block units, the predetermined number being a smallest integer equal to or larger than a quotient of the delay associated with the respective one of the $1^{st}$ to (N−1)th block units divided by the number (N);

the lines of the data buffer being read sequentially when outputting the block units stored in the data buffer;

for the lines of the data buffer having a size sufficient to accommodate more than one of the block units, the block units being stored and read therefrom in a first-in, first-out manner.

12. The method of claim 11, further comprising the steps of, after writing operation of the lines of the data buffer, checking address boundary conditions of the lines, and resetting a subsequent memory access address for the lines to a predetermined starting address when the subsequent memory access address does not fall within the address boundary conditions.

13. An apparatus for interleaving an incoming stream of data blocks, the interleaving being accomplished at a predetermined interleaving depth (D), each of the data blocks having a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the block units in the designated one of the data blocks, said apparatus comprising:
  a data buffer configured to have a number of lines equal to (N−1), each of which is used to store a respective one of the $1^{st}$ to (N−1)th block units, each of the lines having a size sufficient to accommodate a predetermined number of the block units, the predetermined number being a smallest integer equal to or larger than a quotient of the delay associated with the respective one of the $1^{st}$ to (N−1)th block units divided by the number (N);
  output means for outputting one of the block units of the incoming stream directly when the delay associated therewith is equal to zero; and
  control means for, when the delay associated with said one of the block units of the incoming stream is not equal to zero,
    generating a reading index-for reading one of the block units stored in said data buffer,
    controlling said output means to output said one of the block units read-from said data buffer,
    generating a writing index, and
    storing said one of the block units of the incoming stream in the respective one of the lines of said data buffer in accordance with the writing index.

14. The apparatus of claim 13, wherein said control means reads the lines of said data buffer sequentially when outputting the block units stored in said data buffer.

15. The apparatus of claim 13, wherein the reading index is generated by incrementing a variable (i) under modulo N conditions.

16. The apparatus of claim 13, wherein the writing index is equal to a remainder of the quotient of the sum of the index of the block unit in the corresponding data block of the incoming stream and the delay associated therewith, divided by the number (N).

17. The apparatus of claim 13, wherein, for the lines of said data buffer having a size sufficient to accommodate more than one of the block units, said control means stores and reads the block units therefrom in a first-in, first-out manner.

18. The apparatus of claim 13, wherein, after writing operation of the lines of said data buffer, said control means checks address boundary conditions of the lines, and resets a subsequent memory access address for the lines to a predetermined starting address when the subsequent memory access address does not fall within the address boundary conditions.

19. The apparatus of claim 13, wherein said output means includes a multiplexer.

20. An apparatus for interleaving an incoming stream of data blocks, the interleaving being accomplished at a predetermined interleaving depth (D), each of the data blocks having a predetermined number (N) of block units indexed consecutively from 0 to (N−1), wherein a first one of the block units has no delay associated therewith, and subsequent ones of the block units in a designated one of the data blocks have a delay equal to (D−1) more than an immediately preceding one of the block units in the designated one of the data blocks, said apparatus comprising:
  a data buffer;
  a multiplexer connected to said data buffer and adapted to receive the incoming stream; and
  control means, connected to said data buffer and said multiplexer, for controlling said multiplexer to IS output one of the block units of the incoming stream when the delay associated therewith is equal to zero, and for, when the delay associated with said one of the block units of the incoming stream is not equal to zero,
    generating a reading index for reading one of the block units stored in said data buffer,
    controlling said multiplexer to output said one of the block units read from said data buffer,
    generating a writing index, and
    storing said one of the block units of the incoming stream in the data buffer in accordance with the writing index.

21. The apparatus of claim 20, wherein the reading index is generated by incrementing a variable (i) under modulo N conditions.

22. The apparatus of claim 20, wherein the writing index is equal to a remainder of the quotient of the sum of the index of the block unit in the corresponding data block of the incoming stream and the delay associated therewith, divided by the number (N).

23. The apparatus of claim 20, wherein:
  said data buffer is configured to have a number of lines equal to (N−1), each of which is used to store a respective one of the $1^{st}$ to (N−1)th block units, each of the lines having a size sufficient to accommodate a predetermined number of the block units, the predetermined number being a smallest integer equal to or larger than a quotient of the delay associated with the respective one of the $1^{st}$ to (N−1)th block units divided by the number (N);
  said control means reading the lines of said data buffer when outputting the block units stored in said data buffer;
  for the lines of the data buffer having a size sufficient to accommodate more than one of the block units, said control means storing and reading the block units therefrom in a first-in, first-out manner.

24. The apparatus of claim 23, wherein, after writing operation of the lines of said data buffer, said control means checks address boundary conditions of the lines, and resets a subsequent memory access address for the lines to a predetermined starting address when the subsequent memory access address does not fall within the address boundary conditions.

* * * * *